US007023010B2

(12) United States Patent
Wang et al.

(10) Patent No.: US 7,023,010 B2
(45) Date of Patent: Apr. 4, 2006

(54) SI/C SUPERLATTICE USEFUL FOR SEMICONDUCTOR DEVICES

(75) Inventors: Chia Gee Wang, New York, NY (US); Raphael Tsu, Cornelius, NC (US)

(73) Assignee: Nanodynamics, Inc., New York, NY (US)

( * ) Notice: Subject to any disclaimer, the term of this patent is extended or adjusted under 35 U.S.C. 154(b) by 63 days.

(21) Appl. No.: 10/823,990

(22) Filed: Apr. 14, 2004

(65) Prior Publication Data
US 2004/0227165 A1    Nov. 18, 2004

Related U.S. Application Data

(60) Provisional application No. 60/464,235, filed on Apr. 21, 2003.

(51) Int. Cl.
*H01L 29/06* (2006.01)
(52) U.S. Cl. .......................... 257/15; 257/22; 257/28; 257/76; 257/77; 257/E29.297; 257/E29.298
(58) Field of Classification Search ...................... None
See application file for complete search history.

(56) References Cited

U.S. PATENT DOCUMENTS

| 4,261,771 A | 4/1981 | Dingle et al. |
| 6,294,802 B1 | 9/2001 | Unozawa |
| 6,355,951 B1 | 3/2002 | Hattori |
| 6,376,337 B1 | 4/2002 | Wang et al. |
| 6,452,206 B1* | 9/2002 | Harman et al. ............... 257/22 |
| 6,479,836 B1 | 11/2002 | Suzuki et al. |
| 6,537,911 B1 | 3/2003 | Ko et al. |

OTHER PUBLICATIONS

Tsu, R. "Phenomena in silicon nanostructure devices", *Applied Physics A* (2000), 71: 391-402.
Tsu, Raphael et al. "Quantum Confinement in Silicon", *Proceedings of the Fourth International Symposium on Quantum Confinement: Nanoscale Materials, Devices, and Systems,* vol. 97-11. Cahay, M. et al. Editors. New Jersey: The Electrochemical Society, Inc. 341-351.
Ding, Jinli and Raphael Tsu. "The determination of activation energy in quantum wells", *Appl. Phys. Lett.* (1997), 71(15): 2124-2126.
Seo, Yong-Jin and Raphael Tsu. "Electronic and Optical Characteristics of Multilayer Nanocrystalline Silicon/ Adsorbed Oxygen Superlattice", *Jpn. J. Appl. Phys.* (2001), 40: 4799-4801.
Seo, Yong-Jin et al. "Transport through a nine period silicon/oxygen superlattice", *Applied Physics Letters* (2001), 79(6): 788-790.

* cited by examiner

*Primary Examiner*—Andy Huynh
(74) *Attorney, Agent, or Firm*—Ladas and Parry LLP

(57) ABSTRACT

A Si/C superlattice useful for semiconductor devices comprises a plurality of epitaxially grown silicon layers alternating with carbon layers respectively adsorbed on surfaces of said silicon layers. Structures and devices comprising the superlattice and methods are described.

55 Claims, 3 Drawing Sheets

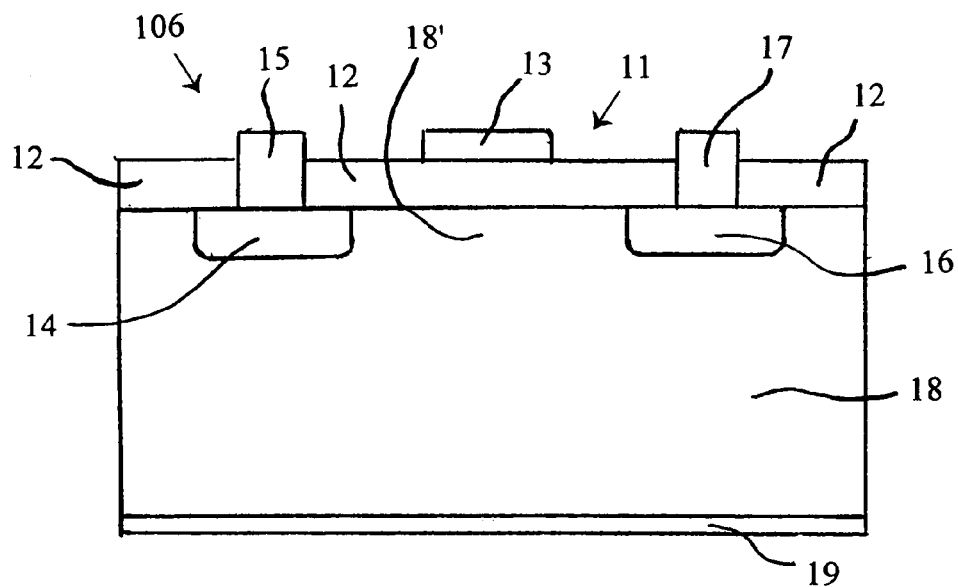
FIG. 6
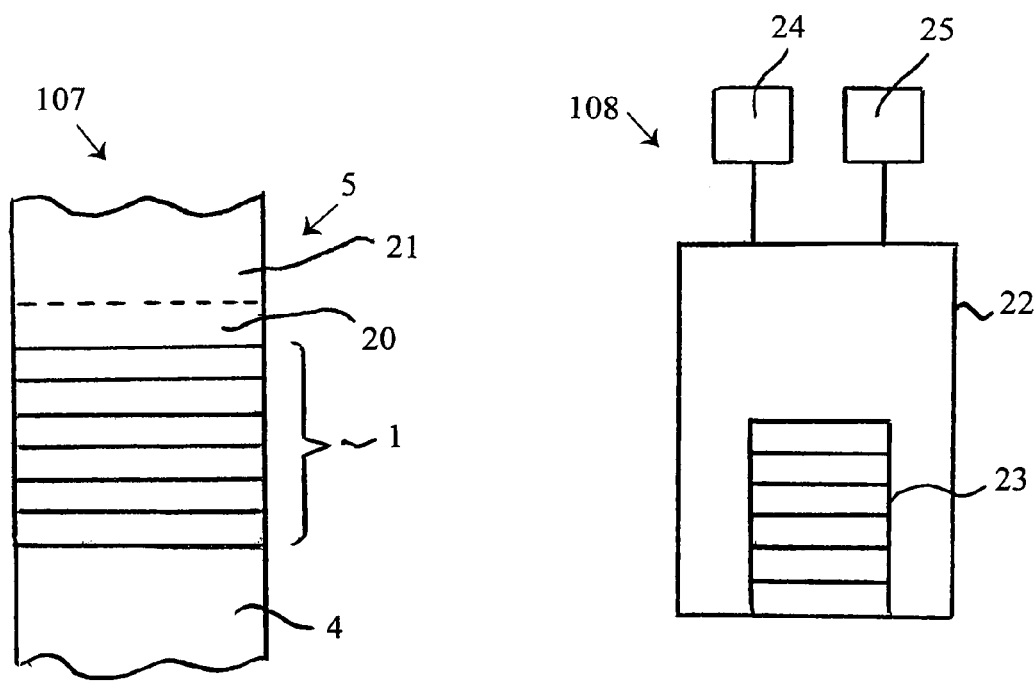
FIG. 7
FIG. 8

SI/C SUPERLATTICE USEFUL FOR SEMICONDUCTOR DEVICES

CROSS-REFERENCE TO RELATED APPLICATION

This application claims the benefit of U.S. Provisional Application No.: 60/464,235 filed Apr. 21, 2003 and incorporates the same by reference.

BACKGROUND OF THE INVENTION

1. Field of the Invention

The present invention relates to a Si/C superlattice useful for semi-conductor devices, in which layers of epitaxial silicon alternate with layers of adsorbed carbon. The invention also relates to structures useful for electronic or opto-electronic devices comprising the superlattice. Such devices include transistors such as field effect transistors, MOSFET's, power transistors, quantum well devices, and light emitting devices.

2. Description of the Related Art

Electronic and opto-electronic devices incorporating superlattices are described, e.g., in U.S. Pat. No. 6,294,802 issued to Unozawa; No. U.S. Pat. No. 6,355,951 issued to Hattori; U.S. Pat. No. 6,479,836 issued to Suzuki et al.; and U.S. Pat. No. 6,452,206 issued to Harman et al.; the disclosure of each of said U.S. patents being incorporated herein by reference.

The production and properties of silicon carbide materials and Si/O superlattices (having alternating silicon and adsorbed oxygen layers) are disclosed in the following publications, which will be referred to below:

1. Silicon Carbide and Related Materials-1999, Oct. 10–15, 1999, ICSCRM'99 Edited by C. H. Carter, Robert P. Devaty and G. S. Rohrer, Trans Tech Publishing, 2000.
2. R. Tsu, A. Filios, J. Lofgren, J. L. Ding, Q. Zhang, J. Morais, and C. G. Wang, Electrochem Soc. Proc. 97–11, 341 (1997).
3. J. Ding and R. Tsu, Appl. Phys. Lett. 71, 2124 (1997).
4. R. Tsu "Si Based Green ELD: Si-Oxygen Superlattice, Phys. Stat. Sol. (a) 180, 333 (2000).
5. D. Morelli, J. Hermans, C. Beetz, W. S. Woo, G. L. Harris and C. Taylor, Inst. Phys. Conf. Ser (UK) 137, 313 (1993).
6. R. Tsu, K. Dovidenko and J. C. Lofgren, Electrochem Soc. Proc. 99–22, 294 (1999).
7. Y. J. Seo and R. Tsu, Jpn J. Appl. Phys. 40, 4799–4801 (2001).
8. Y. J. Seo, J. C. Lofgren and R. Tsu, Appl. Phys. Lett. 79, 788 (2001).
9. U. Gosele "Semiconductor Wafer Bonding" Ann. Rev. Mat. Sci. 28, 215 (1998).

U.S. Pat. No. 6,376,337 issued to Wang et al., and co-pending U.S. Ser. No. 09/617,511 filed Jul. 14, 2000 disclose epitaxial silicon on insulator structures and devices employing a Si/O superlattice.

Silicon carbide power devices have been considered over the years in high power and high temperature environments primarily for their larger bandgap enabling operation at temperatures beyond 300° C., and high thermal conductivity for high power operations. This goal has not been fully realized due mainly to the material defects and the packaging limitations of the devices. At present, silicon carbide wafers are produced mostly at two inch diameter with poor quality. Defects such as micropipes, stacking faults, and dislocations remain quite high on relatively small diameter wafers [see 1 above]. On the other hand, the Si/O superlattice with epitaxially grown silicon layers sandwiched between adsorbed monolayers of oxygen has very low defect density and an effective bandgap much higher than silicon [2,3,4 above]. Such a structure shows two attractive novel functions: the superlattice region can serve as an insulating material allowing the fabrication of epitaxial silicon beyond the insulating superlattice region; and electro- or photo-luminescence in the visible spectrum to be used for possible opto-electronic operations.

The room temperature thermal conductivity of 3C (3-cubic crystal form) SiC is more than three times that of silicon [5 above], and even higher for 6H (6-hexagonal crystal form) SiC. On the other hand, silicon thermal conductivity is higher than $SiO_2$ by an order of magnitude. Without knowing the fundamental reasons for the high thermal conductivity of SiC at present, the trend indicates that the thermal conductivity of the Si/C superlattice will be higher than silicon. Therefore the possibility of fabricating an epitaxially grown low defect Si/C superlattice from a silicon template with an effective bandgap of well over 2 eV and improved thermal conductivity over silicon, indeed offers an ideal material for high temperature electronics. The new Si/C performance characteristics are expected to be superior to silicon carbide currently fabricated by CVD (Chemical Vapor Deposition) under a very high thermal budget, or even superior to GaN materials presently being developed.

BRIEF SUMMARY OF THE INVENTION

The invention provides a Si/C superlattice useful for semiconductor devices, comprising a plurality of epitaxially grown silicon layers alternating with carbon layers respectively adsorbed on surfaces of said silicon layers.

The superlattice may be formed from a structure in which each epitaxial silicon layer has been epitaxially grown on a surface of an underlying silicon layer, said surface of said underlying silicon layer having a carbon layer adsorbed thereon.

Also provided according to the invention is a structure useful for electronic or opto-electronic devices, said structure comprising a Si/C superlattice comprising a plurality of epitaxially grown silicon layers alternating with carbon layers respectively adsorbed on surfaces of said silicon layers, said superlattice having an upper end in the direction of epitaxial silicon layer growth and a lower end in the opposite direction; a top layer comprising epitaxial silicon disposed at said upper end; and a low defect density silicon substrate disposed at said lower end.

In addition, there is provided according to the invention a structure useful for electronic or opto-electronic devices, said structure comprising a Si/C superlattice comprising a plurality of epitaxially grown silicon layers alternating with carbon layers respectively adsorbed on surfaces of said silicon layers, said superlattice having an upper end in the direction of epitaxial silicon layer growth and a lower end in the opposite direction; a top layer comprising epitaxial silicon carbide disposed at said upper end; and a low defect density silicon substrate disposed at said lower end.

Further provided according to the invention is a structure useful for electronic or opto-electronic devices, said structure comprising a Si/C superlattice comprising a plurality of epitaxially grown silicon layers alternating with carbon layers respectively adsorbed on surfaces of said silicon layers, said superlattice having an upper end in the direction of epitaxial silicon layer growth and a lower end in the opposite direction; a top layer comprising polycrystalline silicon carbide disposed at said upper end; and a low defect density silicon substrate disposed at said lower end.

Also provided according to the invention is a semiconductor device comprising an insulator or barrier material, the improvement comprising replacement of said insulator or barrier material with a superlattice comprising a plurality of epitaxially grown silicon layers alternating with carbon layers respectively adsorbed on surfaces of said silicon layers.

There is also provided according to the invention a system for producing low defect density silicon carbide, comprising: a template consisting of a superlattice comprising a plurality of epitaxially grown silicon layers alternating with carbon layers respectively adsorbed on surfaces of said silicon layers; MBE means for depositing epitaxial silicon carbide on said template; CVD means for depositing silicon carbide on said epitaxial silicon carbide.

And also provided according to the invention is a method for manufacturing low defect density silicon carbide for use in semiconductor devices, comprising:
(a) providing a template consisting of a superlattice comprising a plurality of epitaxially grown silicon layers alternating with carbon layers respectively adsorbed on surfaces of said silicon layers;
(b) depositing epitaxial silicon carbide on said template by MBE; and
(c) depositing silicon carbide on said deposited epitaxial silicon carbide by CVD.

In the structure provided by the invention, the "direction of growth" refers to the direction of successive deposits of epitaxial silicon in the Si/C superlattice.

BRIEF DESCRIPTION OF THE DRAWINGS

FIG. 6 is a schematic illustration partly in cross-section of a semiconductor device comprising a superlattice, according to the invention.

FIG. 7 is a schematic illustration of a structure comprising low defect density silicon carbide produced according to the method of the invention.

FIG. 8 is a schematic illustration of a system for producing low defect density silicon carbide according to the invention.

DETAILED DESCRIPTION OF THE INVENTION

Figure 1:
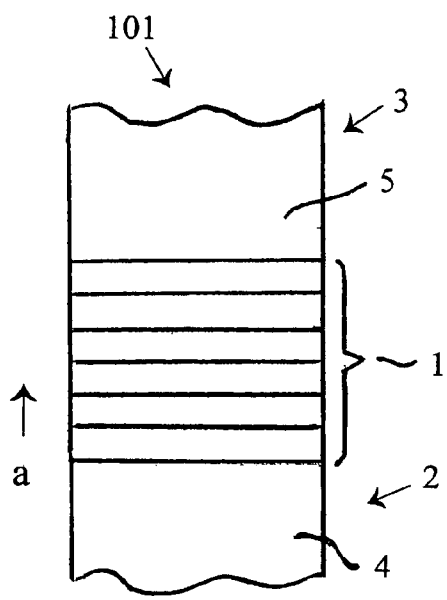
FIG. 1 is a schematic illustration of a structure comprising a superlattice, according to the invention.

The construction of an epitaxially grown Si/C superlattice constitutes an important achievement of the invention. If one looks at the origin of the micropipes and stacking faults of the SiC wafers, there are typically small useful areas with low defect density while in other areas the defects follow the growth pattern, and these defects cannot be annealed away even at elevated temperatures. We have previously succeeded in fabricating Si/O and Si/CO superlattices with very low defect density. Fabricating the Si/C superlattice is done with hydrogen thermally decomposed from the carbon source $CH_4$. Subsequent deposition of Si from $SiH_4$ and C from $CH_4$ at a substrate temperature of 600° C. layer by layer will not initiate micropipes and other defects that seem to occur even at 2,000° C. or higher. A relatively defect-free silicon template is used as seed wafer to help fabricate a low defect Si/C superlattice, which in turn helps the growth of a further SiC superlattice-like layer-by-layer structure.

The Si/C superlattice has the potential to help resolve many problems facing high efficiency, high frequency, as well as high power devices. First of all, wide bandgap semiconductors invariably have more defects. In fact, most of the defects involve some sort of "bonding defects". The energy involved is around the valence band up to 1–2 eV or so into the conduction band. The defect density in the valence band and conduction band is not a source of problems because the high density of states in these bands overwhelms the defects. However, in the forbidden gap, the defects stand out like a light-house in a dark ocean. They can trap carriers into these states creating charged centers as scattering centers. They can reduce the life-time of the excited carrier, or simply reduce the mobility via Coulomb scattering from these centers. The Si/O superlattice disclosed in the above-mentioned U.S. Pat. No. 6,376,337 of Wang et al., is useful to consider as an analogy. That Si/O superlattice at present has a relatively low defect density, being less than $10^9/cm^2$, which is about as low as the best annealed-stabilized $Si/SiO_2$ interface in a good MOSFET. Secondly, the density of state does not go as the usual $(E)^{1/2}$ in the conduction- or valence-bands, rather, it is a series of steps, typical of those in a quantum well. Scattering from defects is much reduced with a 2D density of state because scattering in a 2D k-space is highly limited compared to a 3D k-space. Another way of looking at the reduction of scattering with superlattices is that electrons in a superlattice energy band are compressed into a narrow energy region where there are few defects lying in this range of energy. These are very important rationales for using a superlattice to widen the bandgap rather than using wide bandgap semiconductors such as SiC or GaN. Incidentally, the above inventioned Si/O superlattice exhibits bright green luminescence, indicating that the effective band gap is ~2 eV [4 above], and the possibility of integrating opto-electronics in a silicon-based chip.

In the present invention, carbon is substituted for oxygen to produce a Si/C superlattice, as a new man-made wide bandgap semiconductor to mimic silicon carbide, reducing the defects in SiC as previously discussed, as well as offering epitaxial capability. For example, using Si(100) as a substrate, we introduce the carbon source in the form of $CH_4$ or $C_2H_6$. The Si—C bond is almost double the Si—Si bond strength. The adsorbed C on Si(100) is even more stable than O on Si(100). The Si/C superlattice is fabricated with a MBE (Molecular Beam Epitaxy) system. The MBE deposition technique is disclosed in U.S. Pat. No. 4,261,771 issued to Dingle et al., the disclosure of which is incorporated herein by reference.

An advantage of the Si/C superlattice of the invention is that for fabricating devices, while SiC is well known to be difficult to provide metal contacts for high current flow, the Si/C superlattice can provide completely silicon-based surfaces for metal contact in a layered silicon structure.

The Si/C superlattice may be used as a diffusion stop to further thicken the insulating layer for applications where a high degree of insulation is needed. Oxygen can be diffused into silicon stopped by the Si/C superlattice. An example is a structure of Si//Si/C superlattice//SiO thick layer as insulator at 900° C.//Si.

Fabrication of SiC using CVD on the Si/C Superlattice Substrate

It is also possible to grow the Si/C superlattice with CVD for commercial scale production. The Si/C superlattice can, in addition, be used as a matching section or template to grow SiC in CVD. The above-mentioned Si/O superlattice is stable up to 700–800° C. From bond strength considerations, a Si/C superlattice should be stable up to 900° C. and survive the high temperature CVD operation. We shall initially use MBE to deposit SiC typically at 900° C. on a Si/C superlattice. After obtaining sufficient epitaxially grown SiC on the Si/C superlattice with MBE, further growth is obtained by switching to CVD, even if the high temperature CVD deposition of SiC destroys the Si/C superlattice. It does not matter whether the Si/C superlattice remains or not, once a significantly thick SiC CVD layer is obtained, since the silicon substrate will go, perhaps even before the Si/C superlattice. We know that epitaxy is hard to destroy. The goal is low defects. We can use MBE for SiC on Si/C superlattice on Si. We can oxidize the back, i.e. the silicon substrate leaving SiC on oxide. The resultant is put into a CVD reactor for normal 1600° C. CVD of SiC growth. The Si/C superlattice can be prepared first with each monolayer of C in 16 layers of silicon, gradually changed to 4 layers of silicon with one monolayer of C, and finally down to 2 layers of silicon with each layer of C. This structure is ready for SiC growth.

As indicated above, the Si/C superlattice of the invention may form a structure in which each epitaxial silicon layer has been epitaxially grown on a surface of an underlying silicon layer, said surface of said underlying silicon layer having a carbon layer adsorbed thereon. The formed superlattice may have many epitaxial silicon layers having carbon adsorbed, i.e. periods of Si/C, as may be required for particular devices. Typically, the Si/C superlattice will comprise from 2 to about 16 epitaxial silicon layers, and in some cases 3 to 9 epitaxial silicon layers.

In the Si/C superlattice, the carbon layer adsorbed on the silicon layer surface preferably is a carbon monolayer. Further, it is preferred that each epitaxial silicon layer is an ultrathin layer. Generally this means that each epitaxial silicon layer is less than about 4 nm in thickness, and more preferably each epitaxial silicon layer is less than about 2 nm in thickness.

The fabrication of the Si/C superlattice of the invention normally would start with deposition of an epitaxial silicon layer on a substrate composed of low defect density silicon, preferably having adsorbed carbon on its surface, although other substrates may be used. Thus, preferably the Si/C superlattice according to the invention comprises a low defect density silicon substrate with an adsorbed layer of carbon over which alternating layers of silicon and carbon are grown.

By "low defect density" we mean to include high quality semiconductor material, i.e., material which has substantially fewer defects than known material of the same type. In such material, preferably the defect density will be less than $10^9/cm^2$.

Figure 2:
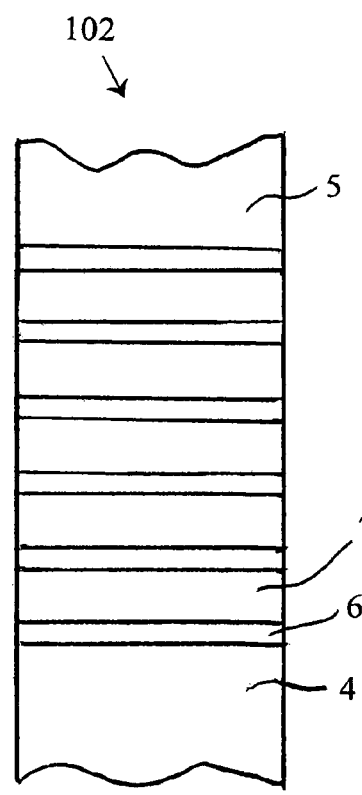
FIG. 2 is a schematic illustration of the structure of FIG. 1 showing details of the superlattice (not to scale).
Figure 3:
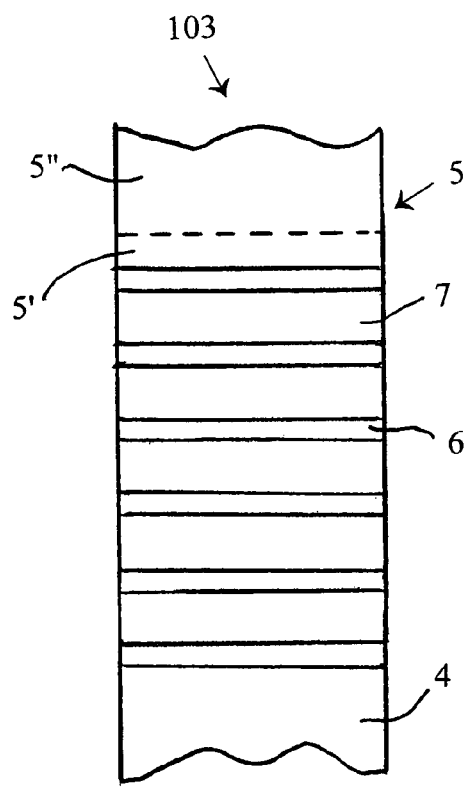
FIG. 3 is a schematic illustration of an embodiment of the structure of FIG. 2.

A structure of the invention useful for fabricating semiconductor devices such as electronic and opto-electronic devices, as shown in FIGS. 1, 2 and 3, comprises a Si/C superlattice according to the invention, a low defect density silicon substrate at its lower end and a top layer at its upper end. The top layer may be made of epitaxial silicon, epitaxial SiC (silicon carbide) or polycrystalline SiC. The top layer may be a single layer as in FIG. 2 or a built up series of layers as in FIG. 3.

Figure 5:
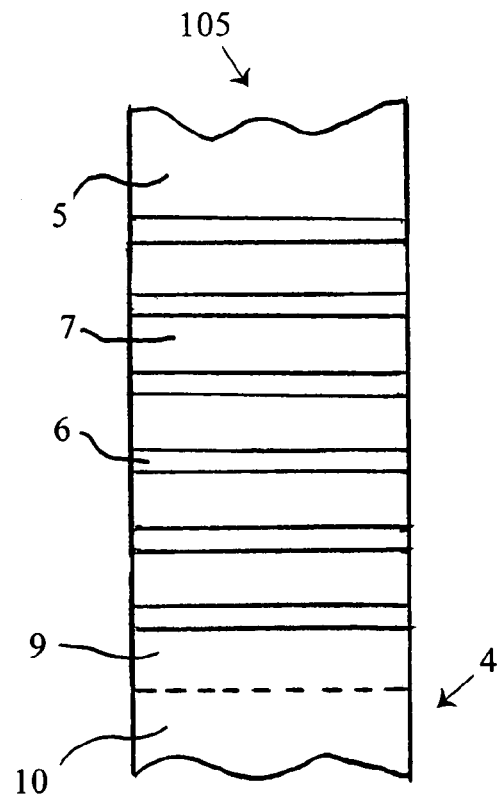
FIG. 5 is a schematic illustration of an embodiment of the structure of FIG. 2.

The substrate may comprise a Si buffer portion as shown in FIG. 5, in which the buffer could be of the order of 200 nm to 300 nm thick, and beneath it merging into Si such as n-type. The top layer will have a thickness depending on the intended use of the structure.

Figure 4:
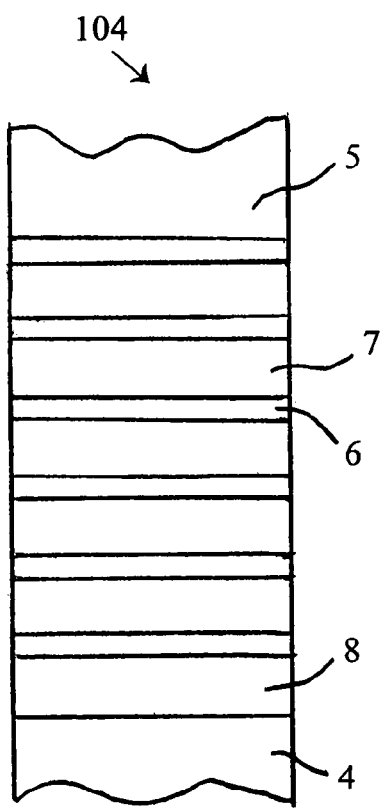
FIG. 4 is a schematic illustration of an embodiment of the structure of FIG. 2.

Further, a layer of silicon oxide may be disposed between the superlattice and the substrate as shown in FIG. 4.

In the structure particularly one having a top layer of SiC, some or all of the Si/C layers of the superlattice may be converted to silicon carbide, for example by heating during growth of the top layer.

The structure of the invention may be used to fabricate semiconductor devices in which the Si/C superlattice of the invention forms an insulator or a barrier. A MOSFET or similar device may be made, such as shown in FIG. 6.

A structure of low defect density silicon carbide resulting from fabrication on a template of the Si/C superlattice is shown in FIG. 7. A system for such fabrication is shown in FIG. 8. The CVD procedure is described in U.S. Pat. No. 6,537,911 issued to Ko, et al., the disclosure of which is incorporated herein by reference.

The different CVD techniques are intended to be included, such as UHVCVD (ultrahigh vacuum) and CBVD (chemical beam, similar to molecular beam) etc. These techniques generally are done by the addition of energy (in the form of heat, plasma, etc.) to a vaporized species to cause the desired deposition, or by the focusing of energy on a solid sample of the material to cause its deposition.

The Si/C superlattice can have an effective bandgap of over 2 eV with possibly even lower defect density than the Si/O superlattice. As silicon may be used as a substrate, the system is fully compatible with silicon processing technology.

Structure 101 in FIG. 1 comprises superlattice 1 on a low defect density Si substrate 4 located at the lower end 2 of the structure. Upper end 3 is in the direction of growth of the layers, the direction being shown by arrow a. A top layer 5 at upper end 3 comprises epitaxial silicon, epitaxial silicon carbide or polycrystalline silicon carbide. Structure 102 shown in FIG. 2 illustrates details of the superlattice, not shown to scale, in which the superlattice is above substrate 4 and below top layer 5. The superlattice comprises layers of epitaxial silicon 7 grown on underlying layers of adsorbed carbon 6. A variation of the structure of FIG. 2 is shown in FIG. 3 in which structure 103 comprises the same elements except that top layer 5 is composed of more than a single grown layer. Top layer 5 is shown as comprising a first grown layer 5' on which is grown a further layer 5". Layers 5' and 5" may consist of epitaxial silicon or they may consist of silicon carbide.

Another variation of the structure of FIG. 2 is shown in FIG. 4 in which structure 104 comprises the same elements except that a layer of silicon oxide 8 is disposed above substrate 4. Still another variation of the structure of FIG. 2 is shown in FIG. 5 in which structure 105 comprises the same elements except that silicon substrate 4 comprises buffer layer or region 9 below which is the remaining layer or region 10 of the silicon substrate.

Combinations of the embodiments and variations shown in FIGS. 2, 3, 4 and 5 are meant to be included in the structures of the invention.

FIG. 6 illustrates, as an example, semiconductor device 106 which is a MOSFET comprising as insulator the superlattice of the invention. Device 106 comprises gate 11 consisting of insulator 12, comprising the superlattice of the invention, and metal gate electrode 13. Insulator 12 is above a region 18' of substrate 18 which separates source 14 and drain 16. Source 14 is contacted by metal electrode 15, and drain 16 is contacted by metal electrode 17. Below and contacting substrate 18 is metal back contact 19. Source 14 and drain 16 may be composed of n-type silicon, and substrate 18 of p-type silicon.

FIG. 7 illustrates a structure 107 in which a top layer 5 of low defect density silicon carbide is fabricated by depositing SiC on superlattice 1. A first layer 20 of epitaxial SiC may be deposited by MBE on superlattice 1, and a further layer 21 of SiC is deposited by CVD on first SiC layer 20. Alternatively SiC may be deposited initially on superlattice 1 by CVD.

The system used for production of the structure of FIG. 7 is shown in FIG. 8. System 108 comprises chamber 22 which can be evacuated. Disposed within chamber 22 is template 23 which comprises the superlattice of the invention. MBE means 24 and CVD means 25 communicate with chamber 22. Alternatively, MBE means 24 and CVD means 25 may communicate respectively with separate chambers, and the template may be transferred from one chamber to the next.

We have shown earlier that the Si/O superlattice can serve as a barrier as well as isolation for Si devices. The Si/C is even a better candidate for operation at even higher temperature. In fact, reducing the thickness of the silicon layer from 1.1 nm to 0.54 nm should further increase the effective bandgap to a predicted value of 2.5 eV! It is emphasized that a bandgap of 2.5 eV should allow operation well above 400° C. in order to prevent the transformation of extrinsic conduction to intrinsic conduction resulting in the failure of the intended design for the device. On the other hand, even the thermal conductivity may be increased sufficiently to render improved power handling capability, though it is probably still significantly below that of SiC being 5 W $cm^{-1}C^{-1}$. Nevertheless, the Si/C superlattice, with low defect density and relatively high mobility will be useful in new applications in high temperature electronics and even in opto-electronics.

Theoretically a SiC MOSET would enjoy higher voltage capability and lower resistance than the silicon counterpart. In practice, the SiC MOSFET suffers from low channel mobility and the oxide reliability leading to breakdown problems. These difficulties should not appear when fabricating the layered Si/C superlattice structure.

Another obvious application of Si/C material is for high power, high voltage diodes. Today, these large diodes are made of silicon (Schottky or PiN) and the limiting factor is how fast the heat can be removed from the center of the diode where no thermal management can directly reach. Equipped with very high thermal conductivity, the Si/C superlattice of the invention can provide a diode dimension of several inches instead of the current SiC device size at one mm, and thereby serve for high power switching.

While the Si/C superlattice region is typically very thin, and must be fabricated on a silicon wafer substrate, the substrate can easily be oxidized and a pair of Si/C wafers can be bonded onto each other face-to-face [9 above], allowing one oxide silicon layer to be etched away. By such means, the Si/C region is twice as thick on a silicon substrate. Another similar process can bond together a pair of the last said Si/C wafers and having one silicon oxide substrate etched away. This bonding process can be repeated until the Si/C superlattice region has reached sufficient thickness.

The superlattice FET (SFET) will operate very differently from a MOSFET, and may supplement the latter. Commercially, up to 85% of silicon chips use CMOS technology. If SFET can replace even a small fraction of the MOSFET usage for improved speed, power performance and temperature tolerance, the economic impact would be enormous.

What is claimed is:

1. A Si/C superlattice useful for semiconductor devices, comprising a plurality of epitaxially grown silicon layers alternating with carbon layers respectively adsorbed on surfaces of said silicon layers.

2. A Si/C superlattice according to claim 1, wherein said superlattice forms a structure in which each epitaxial silicon layer has been epitaxially grown on a surface of an underlying silicon layer, said surface of said underlying silicon layer having a carbon layer adsorbed.

3. The Si/C superlattice according to claim 1, comprising from 2 to about 16 epitaxial silicon layers.

4. The Si/C superlattice according to claim 3, comprising 3 to 9 expitaxial silicon layers.

5. The Si/C superlattice according to claim 1, wherein the carbon layer adsorbed on the silicon layer surface is a carbon monolayer.

6. The Si/C superlattice according to claim 2, wherein the carbon layer adsorbed on the silicon layer surface is a carbon monolayer.

7. The Si/C superlattice according to claim 1, wherein each epitaxial silicon layer is an ultrathin layer.

8. The Si/C superlattice according to claim 7, wherein each epitaxial silicon layer is less than about 4 nm in thickness.

9. The Si/C superlattice according to claim 7, wherein each epitaxial silicon layer is less than about 2 nm in thickness.

10. The Si/C superlattice according to claim 1, further comprising a low defect density silicon substrate over which said alternating layers of silicon and carbon were grown.

11. The Si/C superlattice according to claim 10, wherein a surface of said substrate has an adsorbed layer of carbon over which a layer of silicon of said superlattice was epitaxially grown.

12. A structure useful for electronic or opto-electronic devices, said structure comprising a Si/C superlattice comprising a plurality of epitaxially grown silicon layers alternating with carbon layers respectively adsorbed on surfaces of said silicon layer, said superlattice having an upper end in the direction of epitaxial silicon layer growth and a lower end in the opposition direction; a top layer comprising epitaxial silicon disposed at said upper end; and a low defect density silicon substrate disposed at said lower end.

13. The structure according to claim 12, wherein said superlattice forms a structure in which each epitaxial silicon layer has been epitaxially grown on a surface of an underlying silicon layer, said surface of said underlying silicon layer having a carbon layer adsorbed thereon.

14. The structure according to claim 12, wherein said superlattice comprises from 2 to about 16 epitaxial silicon layers.

15. The structure according to claim 12, wherein said superlattice comprises 3 to 9 epitaxial silicon layers.

16. The structure according to claim 12, wherein in said superlattice the carbon layer adsorbed on the silicon layer surface is a carbon monolayer.

17. The structure according to claim 12, wherein in said superlattice each epitaxial silicon layer is less than about 4 nm in thickness.

18. The structure according to claim 12, wherein in said superlattice each epitaxial silicon layer is less than about 2 nm in thickness.

19. The structure according to claim 12, wherein said silicon substrate comprises a silicon buffer layer disposed in contact with the lower end of said superlattice.

20. The structure according to claim 19, wherein said buffer layer has a thickness of from about 200 nm to about 300 nm.

21. The structure according to claim 12, wherein said epitaxial silicon top layer has a thickness from about 15 nm to about 75 nm.

22. The structure according to claim 12, wherein a layer of silicon oxide is disposed between said superlattice and said substrate.

23. A structure useful for electronic or opto-electronic devices, said structure comprising a Si/C superlattice comprising a plurality of epitaxially grown silicon layers alternating with carbon layers respectively adsorbed on surfaces of said silicon layers, said superlattice having an upper end in the direction of epitaxial silicon layer growth and a lower end in the opposite direction; a top layer comprising epitaxial silicon carbide disposed at said upper end; and a low defect density silicon substrate disposed at said lower end.

24. The structure according to claim 23, wherein said superlattice forms a structure in which each epitaxial silicon layer has been epitaxially grown on a surface of an underlying silicon layer, said surface of said underlying silicon layer having a carbon layer adsorbed thereon.

25. The structure according to claim 23, wherein said superlattice comprises from 2 to about 16 epitaxial silicon layers.

26. The structure according to claim 23, wherein said superlattice comprises 3 to 9 epitaxial silicon layers.

27. The structure according to claim 23, wherein in said superlattice the carbon layer adsorbed on the silicon layer surface is a carbon monolayer.

28. The structure according to claim 23, wherein in said superlattice each epitaxial silicon layer is less than about 4 nm in thickness.

29. The structure according to claim 23, wherein in said superlattice each epitaxial silicon layer is less than about 2 nm in thickness.

30. The structure according to claim 23, wherein said silicon substrate comprises a silicon buffer layer disposed in contact with the lower end of said superlattice.

31. The structure according to claim 30, wherein said buffer layer has a thickness of from about 200 nm to about 300 nm.

32. The structure according to claim 23, wherein a layer of silicon oxide is disposed between said superlattice and said substrate.

33. The structure according to claim 23, wherein one or more epitaxial silicon layers of said superlattice were converted to silicon carbide.

34. The structure according to claim 33, wherein a layer of silicon oxide is disposed between said superlattice and said substrate.

35. A structure useful for electronic or opto-electronic devices, said structure comprising a Si/C superlattice comprising a plurality of epitaxially grown silicon layers alternating with carbon layers respectively adsorbed on surfaces of said silicon layers, said superlattice having an upper end in the direction of epitaxial silicon layer growth and a lower end in the opposite direction; a top layer comprising polycrystalline silicon carbide disposed at said upper end; and a low defect density silicon substrate disposed at said lower end.

36. The structure according to claim 35, wherein said superlattice forms a structure in which each epitaxial silicon layer has been epitaxially grown on a surface of an underlying silicon layer, said surface of said underlying silicon layer having a carbon layer adsorbed thereon.

37. The structure according to claim 35, wherein said superlattice comprises from 2 to about 16 epitaxial silicon layers.

38. The structure according to claim 35, wherein said superlattice comprises 3 to 9 epitaxial silicon layers.

39. The structure according to claim 35, wherein in said superlattice the carbon layer adsorbed on the silicon layer surface is a carbon monolayer.

40. The structure according to claim 35, wherein in said superlattice each epitaxial silicon layer is less than about 4 nm in thickness.

41. The structure according to claim 35, wherein in said superlattice each epitaxial silicon layer is less than about 2 nm in thickness.

42. The structure according to claim 35, wherein a layer of silicon oxide is disposed between said superlattice and said substrate.

43. The structure according to claim 35, wherein one or more epitaxial silicon layers of said superlattice were converted to silicon carbide.

44. The structure according to claim 43, wherein a layer of silicon oxide is disposed between said superlattice and said substrate.

45. In a semiconductor device comprising an insulator or barrier material, the improvement wherein the insulator or barrier material comprises the Si/C superlattice of claim 1.

46. A system comprising: the Si/C superlattice of claim 1;
- a template consisting of a superlattice comprising a plurality of epitaxially grown silicon layers alternating with carbon layers respectively adsorbed on surfaces of said silicon layers;
- means for depositing epitaxial silicon carbide on said template; and
- CVD means for depositing silicon carbide on said epitaxial silicon carbide.

47. The Si/C superlattice of claim 1 produced by a method comprising:
- (a) providing a template consisting of a superlattice comprising a plurality of epitaxially grown silicon layers alternating with carbon layers respectively adsorbed on surfaces of said silicon layers;
- (b) depositing epitaxial silicon carbide on said template by; and
- (c) depositing silicon carbide on said deposited epitaxial silicon carbide by CVD.

48. The Si/C superlattice according to claim 47, wherein said template provided in step (a) is produced by MBE wherein each epitaxial silicon layer has been epitaxially grown on a surface of an underlying silicon layer, said surface of said underlying silicon layer having a carbon layer adsorbed thereon.

49. The Si/C superlattice according to claim 47, wherein epitaxial silicon carbide is deposited in step (b) at a temperature from not exceeding about 1000° C.

50. The Si/C superlattice according to claim 47, wherein the expitaxial silicon carbide is deposited in step (b) by MBE.

51. A structure useful for electronic or opto-electronic devices, said structure comprising a Si/C superlattice comprising a plurality of epitaxially grown silicon layers alternating with carbon layers respectively adsorbed on surfaces of said silicon layers, said superlattice having an upper end in the direction of epitaxial silicon layer growth and a lower end in the opposite direction; and a top layer comprising silicon carbide deposited by CVD disposed at said upper end.

52. The structure according to claim 51, wherein one or more epitaxial silicon layers of said superlattice were converted to silicon carbide.

53. The structure according to claim 51, further comprising a low defect density silicon substrate disposed at said lower end.

54. The structure according to claim 52, further comprising a low defect density silicon substrate disposed at said lower end.

55. A method for manufacturing low defect silicon carbide for use in semiconductor devices, comprising:
 (a) providing a template consisting of a superlattice comprising a plurality of epitaxially grown silicon layers alternating with carbon layers respectively adsorbed on surfaces of said silicon layers;
 (b) depositing epitaxial silicon carbide on said tamplate; and
 (c) depositing silcon carbide on said depositing epitaxial silicon carbide by CVD.

* * * * *